(12) United States Patent
Chen et al.

(10) Patent No.: US 12,212,826 B2
(45) Date of Patent: Jan. 28, 2025

(54) CAMERA DEVICE

(71) Applicant: LANTO ELECTRONIC LIMITED, Kunshan (CN)

(72) Inventors: Tao-Chun Chen, Taipei (TW); Fu-Yuan Wu, Taipei (TW); Yu-Cheng Lin, Taipei (TW)

(73) Assignee: LANTO ELECTRONIC LIMITED, Kunshan (CN)

( * ) Notice: Subject to any disclaimer, the term of this patent is extended or adjusted under 35 U.S.C. 154(b) by 159 days.

(21) Appl. No.: 17/980,117

(22) Filed: Nov. 3, 2022

(65) Prior Publication Data

US 2023/0142061 A1 May 11, 2023

(30) Foreign Application Priority Data

Nov. 5, 2021 (CN) .......................... 202111303408.2

(51) Int. Cl.
*H04N 23/51* (2023.01)
*G02B 7/08* (2021.01)
*H04N 23/54* (2023.01)
*H04N 23/57* (2023.01)
*H05K 1/18* (2006.01)

(52) U.S. Cl.
CPC ............... *H04N 23/51* (2023.01); *G02B 7/08* (2013.01); *H04N 23/54* (2023.01); *H04N 23/57* (2023.01); *H05K 1/189* (2013.01)

(58) Field of Classification Search
CPC ........ H04N 23/54; H04N 23/57; H04N 23/68; H04N 23/685; H04N 23/687; G03B 2205/0038

USPC ............................................. 348/208.99, 374
See application file for complete search history.

(56) References Cited

U.S. PATENT DOCUMENTS

| | | | | |
|---|---|---|---|---|
| 2015/0195460 | A1* | 7/2015 | Yasuda | H04N 23/687 |
| | | | | 359/557 |
| 2018/0234529 | A1* | 8/2018 | Yu | G02B 27/646 |
| 2021/0318592 | A1* | 10/2021 | Kim | H04N 23/55 |
| 2022/0256065 | A1* | 8/2022 | Minamisawa | H04N 23/685 |

FOREIGN PATENT DOCUMENTS

| | | | |
|---|---|---|---|
| CN | 102483560 | A | 5/2012 |
| CN | 104136986 | A | 11/2014 |
| CN | 113037967 | A | 6/2021 |
| CN | 113259567 | A | 8/2021 |
| JP | 2019-152785 | A | 9/2019 |
| JP | 2019200360 | A * | 11/2019 |
| TW | 202134765 | A | 9/2021 |

* cited by examiner

*Primary Examiner* — Anthony J Daniels
(74) *Attorney, Agent, or Firm* — Birch, Stewart, Kolasch & Birch, LLP

(57) ABSTRACT

The present disclosure provides a camera device including a first frame, a second frame, a camera component, and a driving component. The first frame includes a first arc surface on an inner surface of the first frame and recessing inward to form a circular arc shape. The second frame is movably disposed in the first frame and includes a second arc surface on an outer surface of the second frame and protruding outward to form a circular arc shape. The camera component is fixedly disposed in the second frame. The driving component is disposed on the first frame and the second frame, and the driving component is configured to drive the second frame to rotate with the first direction, the second direction, and the third direction as the axes.

19 Claims, 15 Drawing Sheets

CAMERA DEVICE

CROSS REFERENCE TO RELATED DISCLOSURE

This application claims the priority benefit of China Patent Application Number 202111303408.2, filed on Nov. 5, 2021, the full disclosure of which is incorporated herein by reference.

BACKGROUND

Technical Field

The present disclosure is related to a camera device, and in particular, a camera device with five-axis compensation.

Related Art

The camera device usually has an anti-shake mechanism used to reduce the user's shake during the shooting process, in order to let the users obtain images of good quality. The current camera device may compensate for the vibration of the four axes. More specifically, the four axes refer to linear movement in the X-axis or Y-axis direction orthogonal to the optical axis of the camera lens, rotation with the X-axis as the axis (pitch), and rotation with the Y-axis as the axis (yaw). However, the compensation angle of the current anti-shake mechanism may only be within plus and minus 1.5 degrees, therefore the scope of application of the anti-shake mechanism is small. In addition, for the direction parallel to the optical axis of the camera lens (ie, the Z-axis), the current camera device still may not compensate for the rotation with the Z-axis as the axis (roll). Furthermore, the camera device needs to be provided with a rotating structure and rotating shaft corresponding to the anti-shake compensation function of each axis, which increases the overall complexity and cost. Therefore, how to provide a camera device with five-axis compensation has become an urgent issue to be solved in the art.

SUMMARY

The embodiments of the present disclosure disclose a camera device, in order to solve the problem that the optical compensation angle of the camera device is small and the camera device only has four-axis compensation in the prior art.

In order to solve the above technical problems, the present disclosure is implemented as follows.

A camera device is provided, which includes a first frame, a second frame, a camera component, and a driving component comprising a plurality of magnets and a plurality of coils. The first frame includes a first arc surface, and the first arc surface is on an inner surface of the first frame and recesses inward to form a circular arc shape. The second frame is movably disposed in the first frame and includes a second arc surface, and the second arc surface is on an outer surface of the second frame and protrudes outward to form a circular arc shape. The first arc surface and the second arc surface are matched with each other. The camera component is disposed in the second frame. The magnets and the coils are disposed on the first frame and the second frame, and the coils are configured to be cooperated with the magnets to drive the second frame to rotate with the first direction, the second direction, and the third direction as axes. The first direction, the second direction, and the third direction are perpendicular to one another, and the third direction is parallel to an optical axis of the camera component. When the second frame rotates with the first direction, the second direction, and/or the third direction as the axes, the first arc surface and the second arc surface move relative to each other.

In some embodiments, the circular arc shape of the first arc surface and the circular arc shape of the second arc surface are concentric circles.

In some embodiments, a part of the magnets and the coils of the driving component forms a first driving component, and the first driving component includes a first magnet, a first coil, a second magnet, and a second coil. The first magnet is disposed on the second frame. The first coil is disposed on the first frame and corresponding to the first magnet, and the first coil is configured to interact with the first magnet to drive the second frame to rotate with the first direction as an axis. The second magnet is disposed on the second frame. The second coil is disposed on the first frame and corresponding to the second magnet, and the second coil is configured to interact with the second magnet to drive the second frame to rotate with the second direction as an axis.

In some embodiments, a part of the magnets and the coils of the driving component forms a second driving component, and the second driving component includes a third magnet, a third coil, a fourth magnet, and a fourth coil. The third magnet is disposed on the second frame. The third coil is disposed on the first frame and corresponding to the third magnet, and the third coil is configured to interact with the third magnet to drive the second frame to positively rotate with the third direction as an axis. The fourth magnet is disposed on the second frame. The fourth coil is disposed on the first frame and corresponding to the fourth magnet, and the fourth coil is configured to interact with the fourth magnet to drive the second frame to oppositely rotate with the third direction as an axis.

In some embodiments, the camera device further includes a first circuit component. The first circuit component is movably disposed on the first frame and includes a first flexible circuit board surrounding the first frame and a first connector disposed at one end of the first flexible circuit board, and the first circuit component is electrically connected to the camera component.

In some embodiments, the camera device further includes an elastic connecting piece disposed on the first frame and electrically connecting to the driving component.

In some embodiments, the camera device further includes a base and a cover. The base and the cover cover the first frame and the second frame. The base and the cover respectively have protrusions. The first frame has guiding grooves, and the protrusions of the base and the cover are correspondingly disposed in the guiding grooves.

In some embodiments, the base further has a guiding wall, and the guiding walls cooperate with the driving component to limit the first frame to move.

In some embodiments, the camera device further includes a second circuit component. The second circuit component is fixedly disposed on the first frame and includes a second flexible circuit board surrounding the first frame and a second connector disposed at one end of the second flexible circuit board, and the second circuit component is electrically connected to the driving component.

In some embodiments, the camera device further includes a case disposed on the first frame. The case has a camera opening, and a camera lens of the camera component is exposed by the camera opening.

In some embodiments, the first frame further includes a first upper frame and a first lower frame. The first upper frame and the first lower frame are paired in the third direction, and the first upper frame and the first lower frame together form the first arc surface. The second frame further includes a second upper frame and a second lower frame. The second upper frame and the second lower frame are paired in the third direction, and the second upper frame and the second lower frame together form the second arc surface.

The camera device of the present disclosure may be roughly divided into the first frame located on the outside, the second frame located in the inside, and the camera component located on the second frame. Furthermore, by disposing the contact surfaces between the first frame and the second frame as arc surfaces corresponding to each other, the second frame located inside the first frame and the camera component therein may rotate like a sphere. That is, when the second frame rotates with the first direction, the second direction, and/or the third direction as the axis, the first arc surface and the second arc surface are moving relative to each other. Therefore, the rotation of the second frame relative to the first frame may be guided to stabilize the rotation trajectory of the second frame. In this case, the interference between the various components may be reduced by the spherical structure, therefore the compensation angle may be greatly improved. In addition, the second frame and the camera component may also be driven by the driving component to roll with the direction parallel to the optical axis as the axis. That is, the present disclosure realizes a camera device with a large compensation angle and five-axis compensation. Furthermore, the first frame and the second frame may make the second frame relatively the first frame has the rotation degrees of freedom of the first direction, the second direction, and the third direction at the same time by the first arc surface and second arc surface. Wherein the first arc surface and second arc surface spherically match each other. Due to no need for disposing the rotation structure and rotation shaft corresponding to each axis, the overall complexity and cost are reduced.

BRIEF DESCRIPTION OF THE DRAWINGS

The figures described herein are used to provide a further understanding of the present disclosure and constitute a part of the present disclosure. The exemplary embodiments and descriptions of the present disclosure are used to illustrate the present disclosure and do not limit the present disclosure, in which.

DETAILED DESCRIPTION OF THE EMBODIMENTS

In order to make the objectives, technical solutions, and advantages of the present disclosure clearer, the technical solutions of the present disclosure will be described clearly and completely in conjunction with specific embodiments and the figures of the present disclosure. Obviously, the described embodiments are only a part of the embodiments of the present disclosure, rather than all the embodiments. Based on the embodiments in the present disclosure, all other embodiments obtained by a person of ordinary skill in the art without creative work fall within the protection scope of this disclosure.

The following description is of the best-contemplated mode of carrying out the present disclosure. This description is made for the purpose of illustrating the general principles of the present disclosure and should not be taken in a limiting sense. The scope of the present disclosure is best determined by reference to the appended claims.

Figure 1:
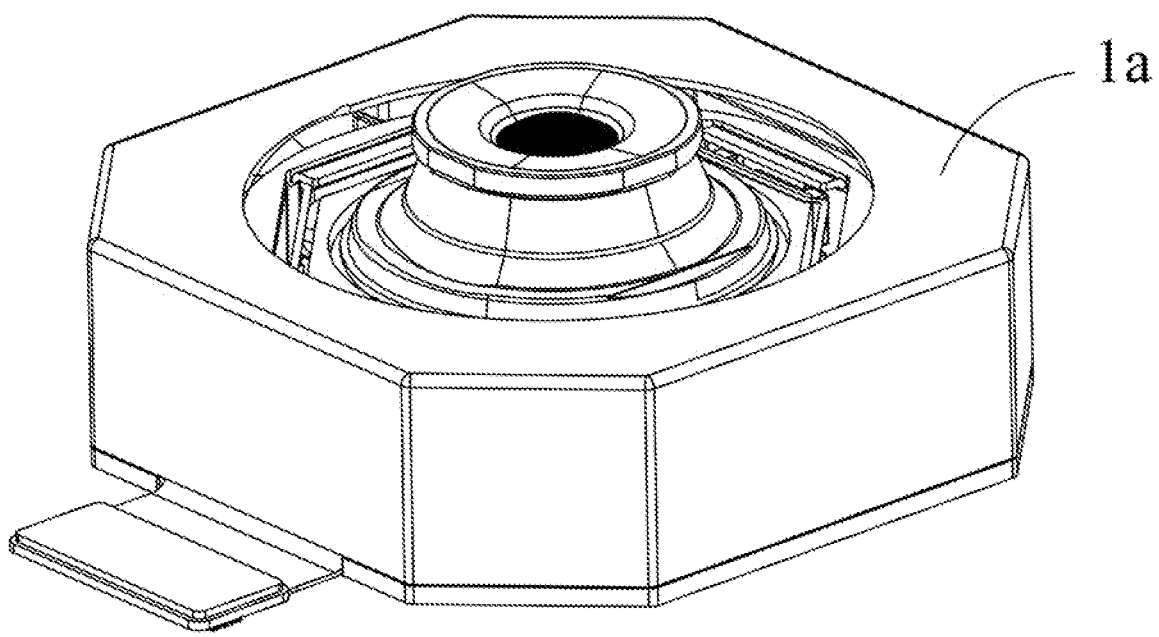
FIG. 1 is a schematic diagram of the camera device according to the first embodiment of the present disclosure.
Figure 2:
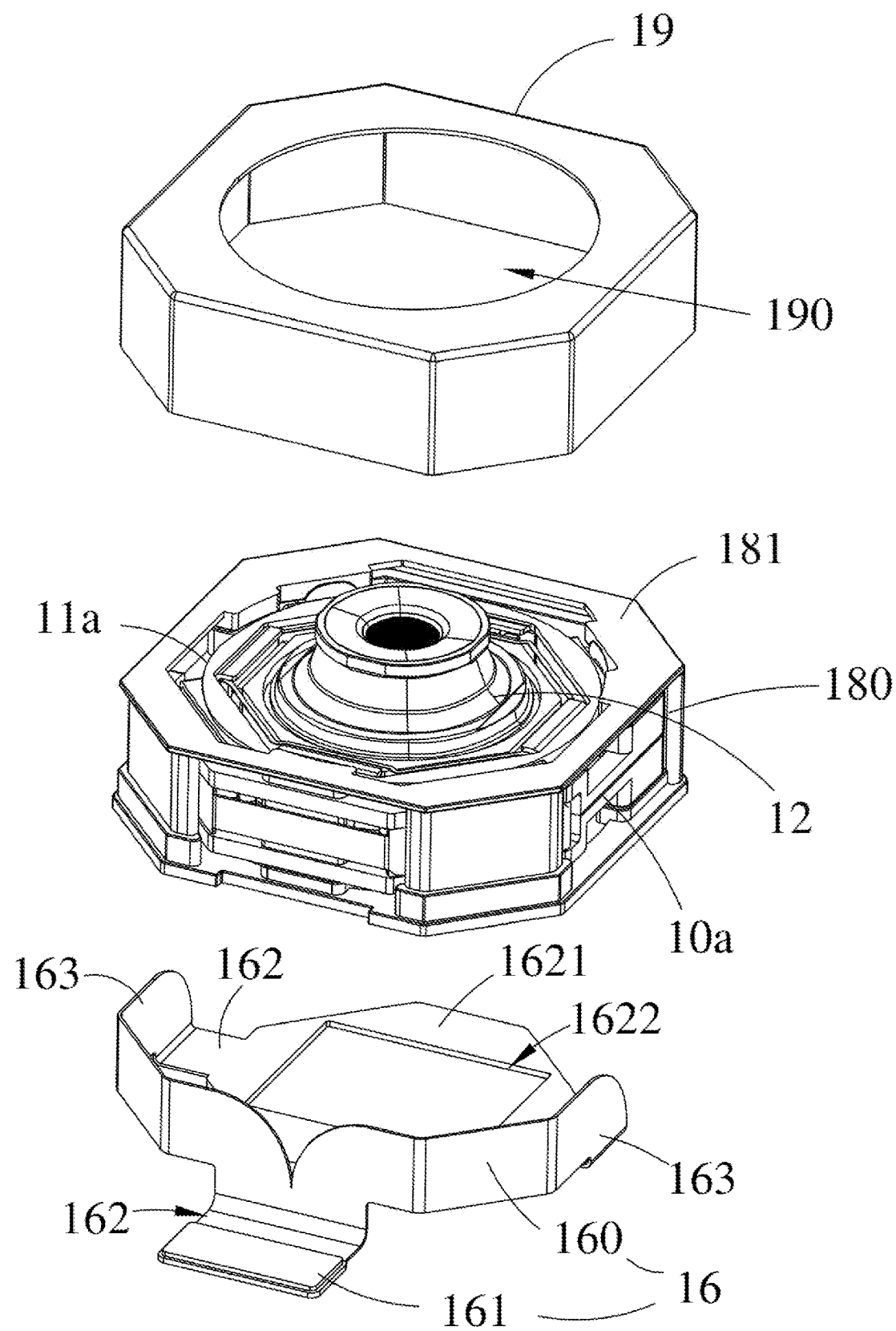
FIG. 2 is an exploded view of the camera device according to the first embodiment of the present disclosure.
Figure 3:
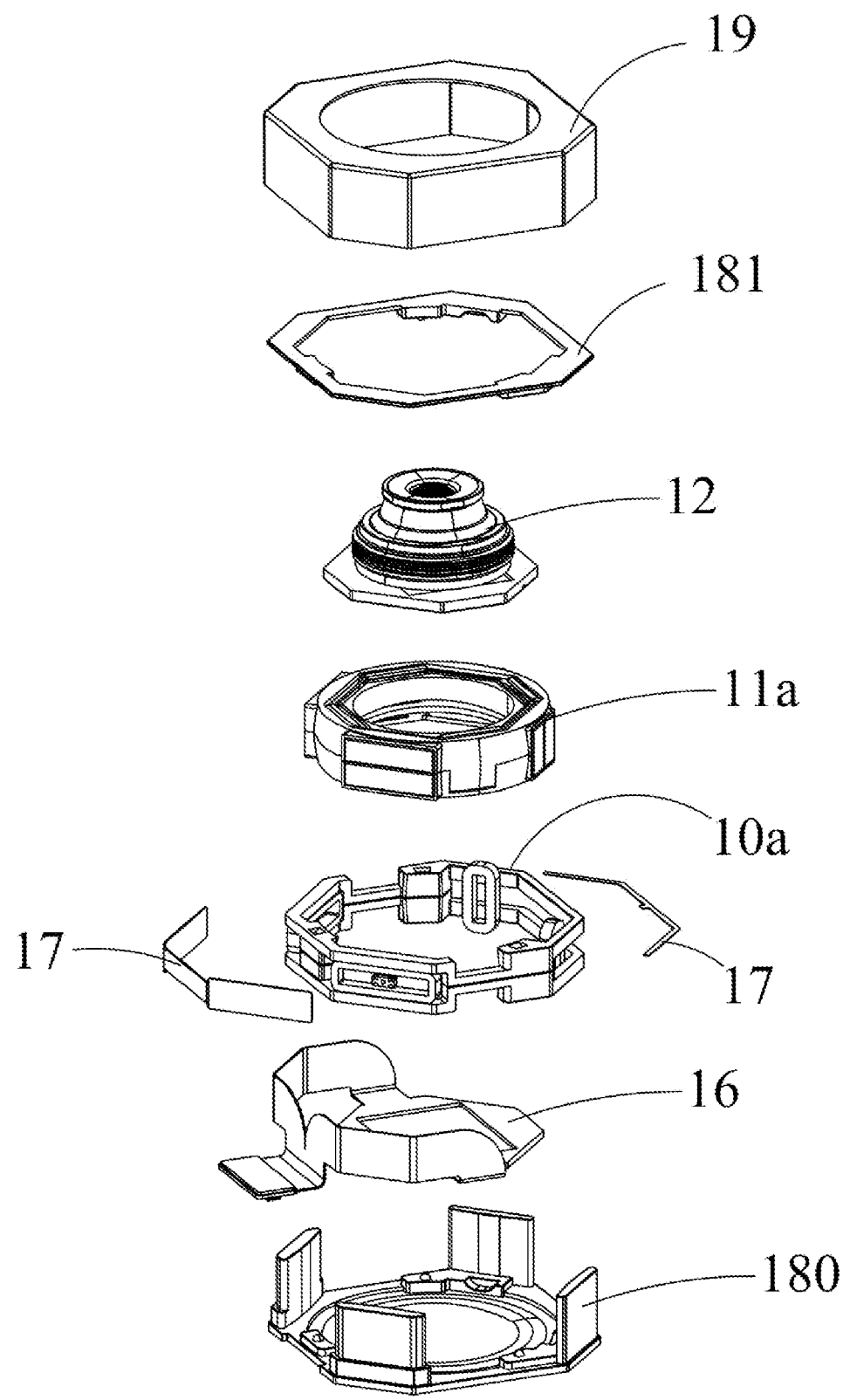
FIG. 3 is another exploded view of the camera device according to the first embodiment of the present disclosure.
Figure 4:
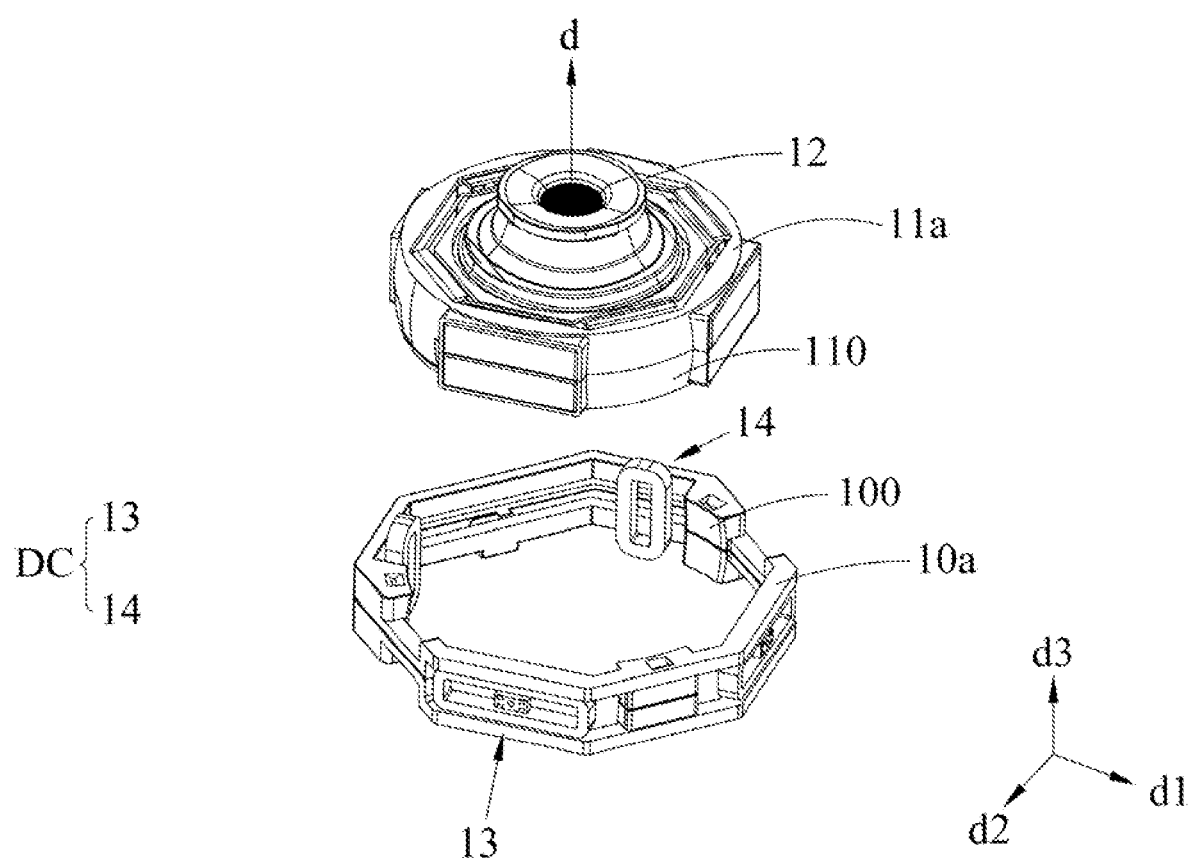
FIG. 4 is a schematic diagram of the first frame, the second frame, and the camera component according to the first embodiment of the present disclosure.

FIG. 1 to FIG. 3 respectively are a schematic diagram, an exploded view, and another exploded view of the camera device according to the first embodiment of the present application, and FIG. 4 is a schematic diagram of the first frame body, the second frame body, and the camera component according to the first embodiment of the present application. As shown in the figures, the camera device 1a includes a first frame 10a, a second frame 11a, a camera component 12, and a driving component DC, wherein the driving component DC may include a first driving component 13 and a second driving component 14 (as shown in FIG. 4). The first frame 10a includes a first arc surface 100, and the first arc surface 100 is on an inner surface of the first frame 10a and recesses inward to form a circular arc shape. The second frame 11a is movably disposed in the first frame 10a and includes a second arc surface 110. The second arc surface 110 is on the outer surface of the second frame 11a and protrudes outward to form a circular arc shape. The first arc surfaces 100 of the first frame 10a cooperates with the second arc surface 110 of the second frame 11a. More specifically, the circular arc shape of the first arc surface 100 and the circular arc shape of the second arc surface 110 are concentric circles. The camera component 12 is fixedly disposed in the second frame 11a. With the structure mentioned above, the second frame 11a and the camera component 12 therein may rotate like a ball in the first frame 10a (as shown in FIG. 4), therefore the compensation angle is greatly increased.

As shown in FIG. 4, the driving component DC (for example, the first driving component 13 and the second driving component 14) is configured to drive the second frame 11a to rotate with a first direction d1, a second direction d2, and a third direction d3 as axes. The first direction d1, the second direction d2, and the third direction d3 are orthogonal to each other, and the third direction d3 is parallel to an optical axis d of the camera component 12. The first arc surface 100 and the second arc surface 110 are configured to move relative to each other when the second frame 11a rotates with the first direction d1, the second direction d2, and/or the third direction d3 as the axis. In some embodiments, the rotation with the first direction d1 as the axis may be represented to "pitch", the rotation with the second direction d2 as the axis may be represented to "yaw", and the rotation with the third direction d3 as the axis may be represented to "roll". That is, not only a large compensation angle may be achieved, but also five-axis compensation may be achieved by combining the first driving component 13 and the second driving component 14 with the spherical structure mentioned above. It should be noted that the compensation angle range of the present disclosure may be within ±3 degrees, which is significantly better than ±1.5 degrees of the existing device.

The various elements mentioned above will be further explained hereinafter, and different implementation aspects will be provided for reference in order to make the technology of the present disclosure clearer and easier to understand.

Figure 5:
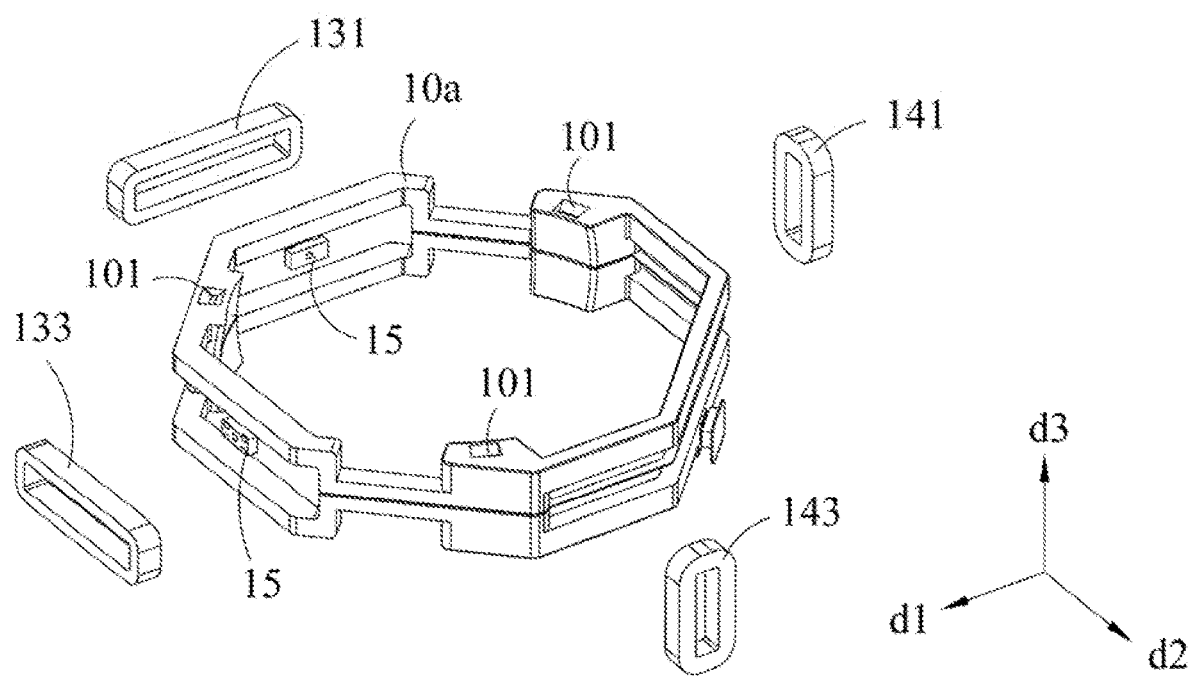
FIG. 5 is a schematic diagram of the first frame according to the first embodiment of the present disclosure.
Figure 6:
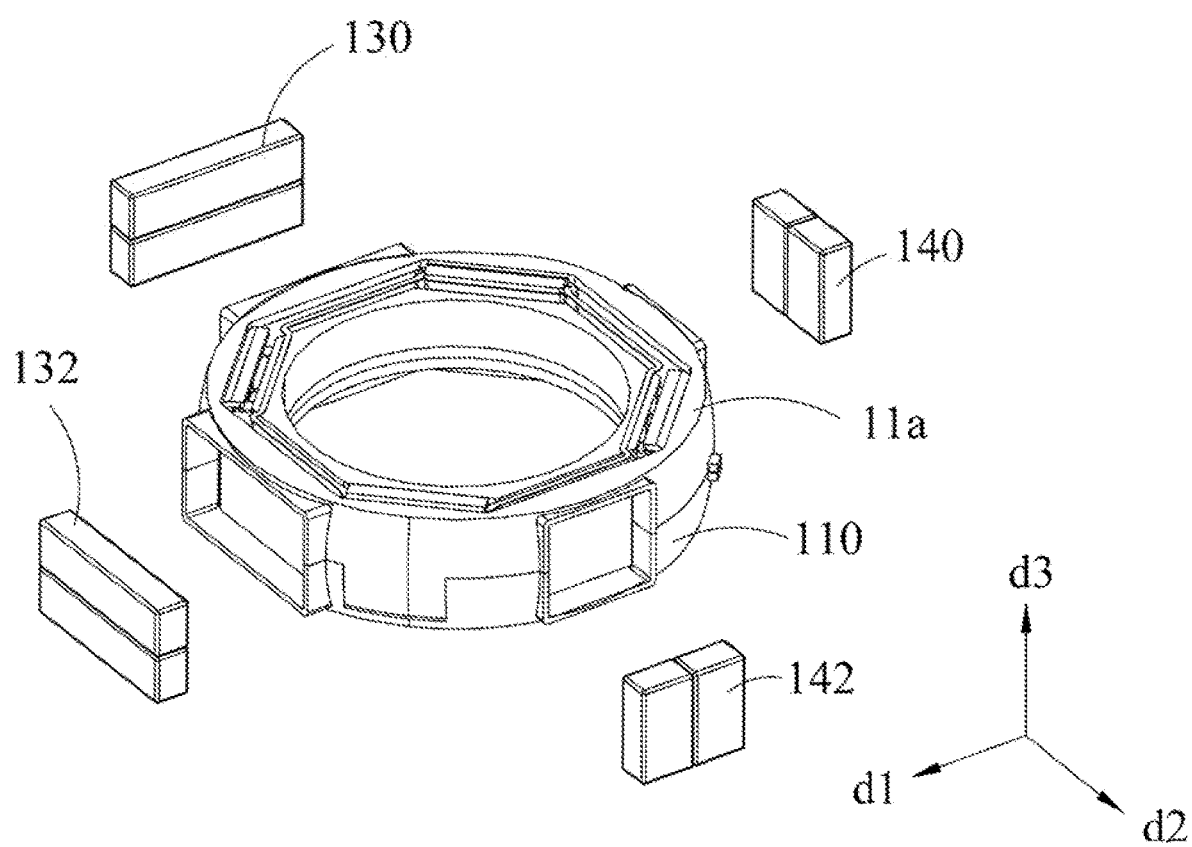
FIG. 6 is a schematic diagram of the second frame according to the first embodiment of the present disclosure.

FIG. 5 and FIG. 6 respectively are a schematic diagram of the first frame and a schematic diagram of the second frame of the first embodiment of the present disclosure. As shown in the figures, in some embodiments, the first driving component 13 includes a first magnet 130, a first coil 131, a second magnet 132, and a second coil 133. The first magnet 130 is disposed on the second frame 11a. The first coil 131 is disposed on the first frame 10a and corresponds to the first magnet 130, and the first magnet 130 is configured to interact with the first magnet 130 to drive the second frame 11a to rotate with the first direction d1 as the axis. More specifically, the first coil 131 may be a copper wire, an aluminum wire, an alloy wire, or a wire with good electrical conductivity, which may generate a magnetic field when energized. On the other hand, the first magnet 130 is a permanent magnet having an inherent magnetic field. As a result, the first coil 131 and the first magnet 130 attract or repel to each other when the magnetic field generated by the electrification of the first coil 131 generates electromagnetic interaction with the inherent magnetic field of the first magnet 130. The second frame 11a may be driven to move relative to the first frame 10a through the interaction between the first coil 131 and the first magnet 130. The first coil 131 and the first magnet 130 are arranged along the second direction d2 to drive one side of the second frame 11a close to the first coil 131 to rise/decline and to relatively drive the other side of the second frame 11a to decline/rise. From another perspective, the decline/rise process of the side of the second frame 11a close to the first coil 131 is the process of rotating the second frame 11a with the first direction d1 as the axis. From another perspective, the decline/rise process of the side of the second frame 11a close to the first coil 131 is the process of rotating the second frame 11a with the first direction d1 as the axis.

The second magnet 132 is disposed on the second frame 11a. The second coil 133 is disposed on the first frame 10a and corresponds to the second magnet 132, and the second coil 133 is configured to interact with the second magnet 132 to drive the second frame 11a to rotate with the second direction d2 as the axis. The motion principle of the second coil 133 and the second magnet 132 is similar to that of the first coil 131 and the first magnet 130, therefore the description thereof is omitted. Wherein, the second coil 133 and the second magnet 132 are arranged along the first direction d1 to drive one side of the second frame 11a close to the second coil 133 to rise/decline, and relatively drive the other side of the second frame 11a to decline/rise. From another perspective, the rise/decline process of the side of the second frame 11a close to the second coil 133 is the process of rotating the second frame 11a with the second direction d2 as the axis.

In some embodiments, the second driving component 14 includes a third magnet 140, a third coil 141, a fourth magnet 142, and a fourth coil 143. The third magnet 140 is disposed on the second frame 11a. The third coil 141 is disposed on the first frame 10a and corresponds to the third magnet 140, and the third coil 141 is configured to interact with the third magnet 140 to drive the second frame 11a to positively rotate with the third direction d3 as the axis. The fourth magnet 142 is disposed on the second frame 11a. The fourth coil 143 is disposed on the first frame 10a and corresponds to the fourth magnet 142, and the fourth coil 143 is configured to interact with the fourth magnet 142 to drive the second frame 11a to oppositely rotate with the third direction d3 as the axis. The motion principles of the third coil 141, the third magnet 140, the fourth coil 143, and the fourth magnet 142 are similar to those of the first coil 131 and the first magnet 130, and the description thereof is omitted. The third coil 141 and the third magnet 140 are arranged along the first direction d1, and the fourth coil 143 and the fourth magnet 142 are arranged along the second direction d2, thereby driving the second frame 11a to clockwise or counterclockwise rotate with the third direction d3 as the axis (or with the optical axis d of the camera component 12 as the axis).

In some embodiments, the camera device 1a further includes a plurality of positioning iron-pieces 15. The plurality of positioning iron-pieces 15 respectively are disposed in the first coil 131, the second coil 133, the third coil 141, and the fourth coil 143. Wherein, the inherent magnetic fields of the first magnet 130, the second magnet 132, the third magnet 140, and/or the fourth magnet 142 attract the plurality of positioning iron-pieces 15. When the camera device 1a is not powered, the first driving component 13 and the second driving component 14 do not operate. As the result, the first magnet 130, the second magnet 132, the third magnet 140, and/or the fourth magnet 142 are close to the plurality of positioning iron-pieces 15 without interference from the magnetic field of the coil, so that the camera component 12 maintains a neutral position.

As shown in FIG. 2 and FIG. 3, in some embodiments, the camera device 1a further includes a first circuit component 16 used to connect an external electronic device and the camera component 12. Therefore, focusing of the camera component 12 may be controlled by the signal and the power supply of the external electronic device through the first circuit component 16. More specifically, the first circuit component 16 is movably disposed on the first frame 10a and includes a first flexible circuit board 160 surrounding the first frame 10a and a first connector 161 disposed at one end of the first flexible circuit board 160. By disposing the first circuit component 16 with a three-dimensional structure (that is, the first circuit component 16 may be in contact with the first frame 10a to a certain extent but does not move with the first frame 10a), the interference between the first circuit component 16 and other components may be effectively reduced. As shown in FIGS. 2-4 and FIG. 11, the first flexible circuit board 160 surrounds the first frame 10a on a reference plane parallel to the first direction d1 and the second direction d2, and the first flexible circuit board 160 surrounds the optical axis d of the camera component 12. As shown in FIG. 2, in some embodiments, the first flexible circuit board 160 further comprises a horizontal section 162 parallel to the first direction d1 and the second direction d2 and a surrounding section 163 parallel to the third direction d3. The first connector 161 is on the horizontal section 162, and the surrounding section 163 extends from the horizontal section 162 and surrounds the first frame 10a. In some embodiments, the horizontal section 162 comprises an annular connecting part 1621, and the annular connecting part 1621 has a hollow portion 1622 for receiving optical component. The surrounding section 163 has two ends respectively connected to two sides of the annular connecting part 1621 opposite to each other.

As shown in FIG. 3, in some embodiments, the camera device 1a further includes an elastic connecting piece 17. The elastic connecting piece 17 is disposed on the first frame 10a and is electrically connected to the first driving component 13 and the second driving component 14 of the driving component DC. More specifically, the elastic connecting piece 17 is used to connect the external electronic device with the first driving component 13 and the second driving component 14 of the driving component DC. The current direction of each coil (ie, the first coil 131, the second coil 133, the third coil 141, and the fourth coil 143) may be controlled by the signal and power supply of the external electronic device through the elastic connecting piece 17, therefore the compensation effect in three directions is achieved.

Figure 7:
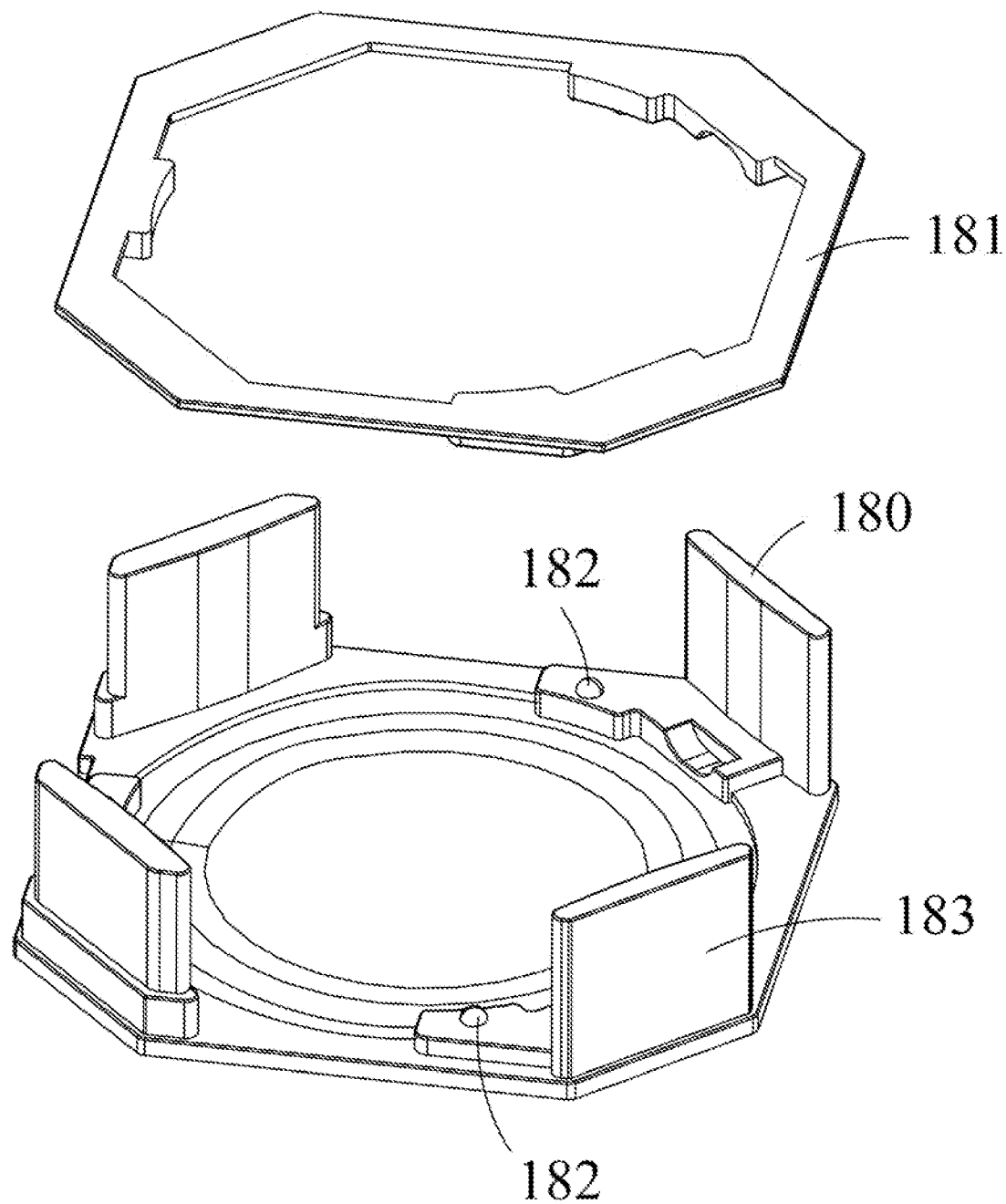
FIG. 7 is a schematic diagram of the base and the cover according to the first embodiment of the present disclosure.
Figure 8:
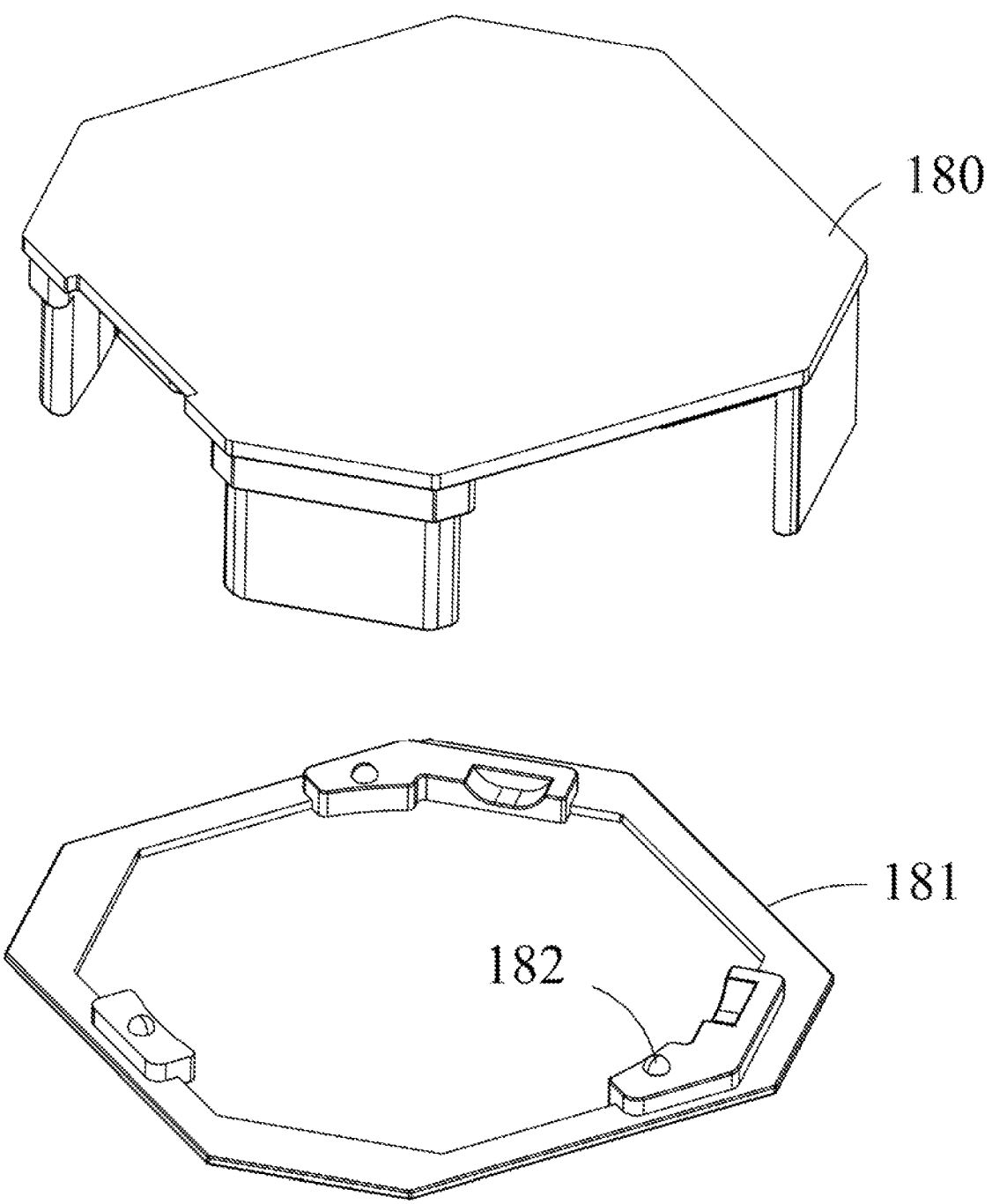
FIG. 8 is another schematic diagram of the base and the cover according to the first embodiment of the present disclosure.
Figure 9:
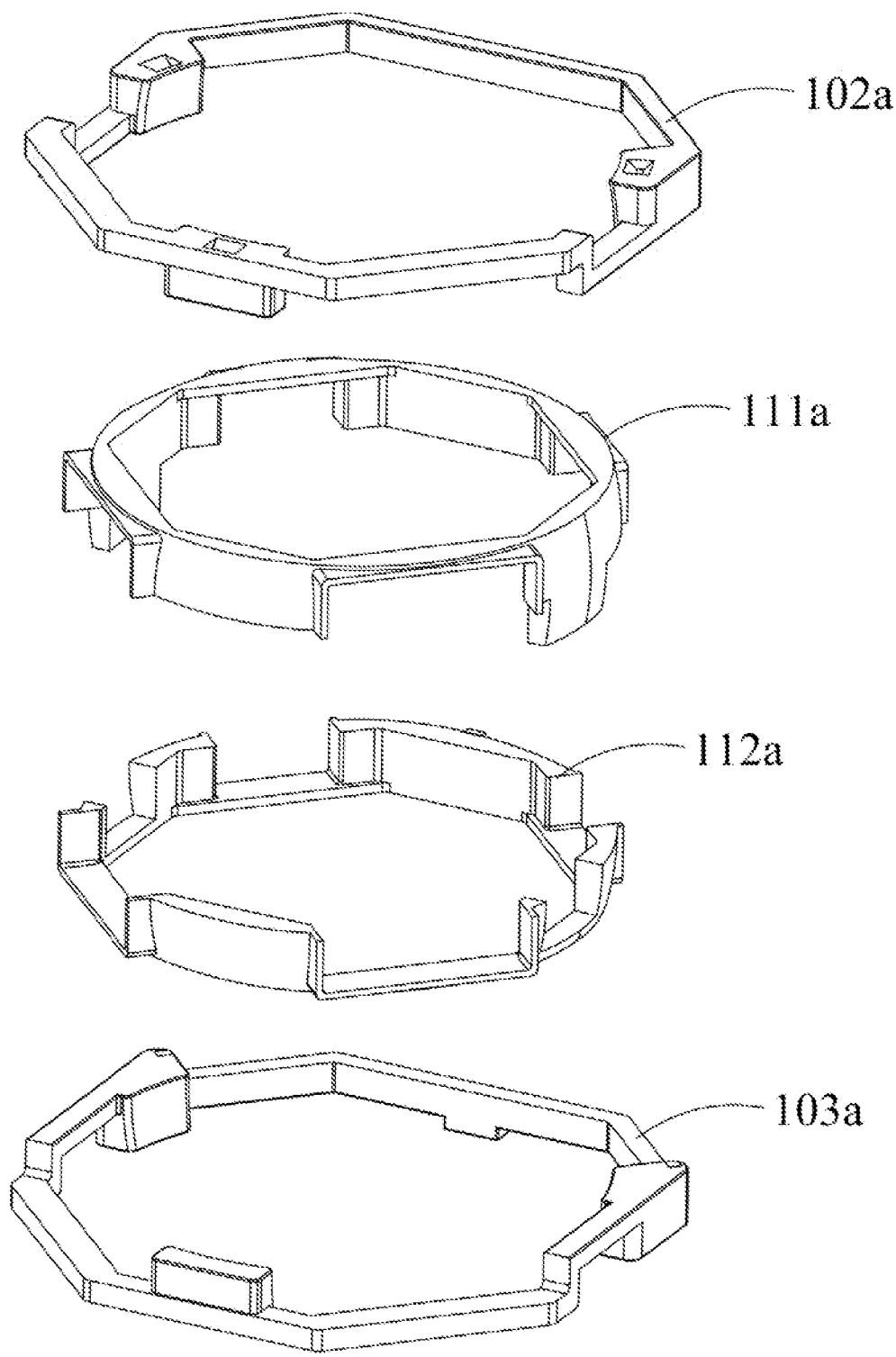
FIG. 9 is an exploded view of the first frame and the second frame according to the first embodiment of the present disclosure.

As shown in FIG. 2, FIG. 5, FIG. 7, and FIG. 8, wherein FIG. 7 and FIG. 8 respectively are a schematic diagram and another schematic diagram of the base and the cover according to the first embodiment of the present disclosure. More specifically, FIG. 7 and FIG. 8 respectively are a perspective view of the base and the cover and a perspective view after being turned over. As shown in the figures, in some embodiments, the camera device 1a further includes a base 180 and a cover 181, and the base 180 and the cover 181 cover the first frame 10a and the second frame 11a. The base 180 and the cover 181 respectively have protrusions 182 (as shown in FIG. 8 and FIG. 9), the upper and lower surfaces of the first frame 10a respectively have guiding grooves 101 (as shown in FIG. 5). The protrusions 182 of the base 180 and the cover 181 are correspondingly disposed in the guiding grooves 101. The compensation angle may be effectively increased by providing the protrusions 182 and the guiding grooves 101 since the elastic connecting piece 17 mentioned above may hinder the rotation of the second frame 11a with the third direction d3 as the axis. It should be noted that, in the present embodiment, the base 180 and the cover 181 respectively have three protrusions 182, and the upper and lower surfaces of the first frame 10a respectively have three guiding grooves 101. However, the present disclosure is not limited thereto. In other embodiments, the number of the protrusions 182 may be one, two, four, five, or more than five, and the number of the guiding grooves 101 may be disposed according to the number of the protrusions 18.

In some embodiments, the base 180 also has guiding walls 183 that cooperate with driving component DC (eg, first driving component 13 and second driving component 14) to limit the activity of first frame 10a. In the present disclosure, the number of guiding walls 183 corresponds to the number of coils in the first driving component 13 and the second driving component 14. That is, the number of the guiding walls 183 is four, and the four guiding walls 183 are respectively disposed to correspond the first coil 131 to the fourth coil 143.

In some embodiments, the camera component 12 includes a closed-circuit motor, a camera lens, and a circuit board (not shown). The closed-circuit motor and the circuit board connect to the external electronic device through the first circuit component 16 to adjust the focus of the camera lens. For example, the closed-circuit motor may be actuated by the interaction between the coil and the magnet, or the focus of the camera lens may be controlled by a method well known by a person having ordinary skills in the art. The description of the method is omitted.

FIG. 9 is an exploded view of the first frame and the second frame according to the first embodiment of the present disclosure. As shown in the figure, in some embodiments, the first frame 10a further includes a first upper frame 102a and a first lower frame 103a. The first upper frame 102a and the first lower frame 103a are paired in third direction d3, and the first upper frame 102a and the first lower frame 103a together form the first arc surface 100. The second frame 11a further includes a second upper frame 111a and a second lower frame 112a. The second upper frame 111a and the second lower frame 112a are paired in the third direction d3, and the second upper frame 111a and the second lower frame 112a together form the second arc surface 110. It should be noted that the combination mentioned above is only an example, and the first frame 10a and the second frame 11a may also be integrally formed. Alternatively, the first frame 10a and the second frame 11a may also be assembled by more components, which may be adjusted according to the requirements of the manufacturing process.

As shown in FIG. 2 and FIG. 3, in some embodiments, the camera device 1a further includes a case 19. The case 19 is disposed on the first frame 10a, and the case 19 has a camera opening 190. The camera lens of the camera component 12 is exposed from the camera opening 190. The case 19 is used to protect the components inside from external dust and moisture, thereby effectively extending the life of the product. It should be noted that the shape of the case 19 is not limited to the shape shown in FIG. 2 and FIG. 3. For example, the case 19 may also be snapped onto other electronic products. That is, the camera device 1a of the present disclosure may be linked with other electronic products. In some embodiments, the first frame 10a is an annular frame penetrated along the optical axis d of the camera component 12. The second frame 11a is an annular frame penetrated along the optical axis d of the camera component. In some embodiments, the camera opening 190, the first frame 10a, the second frame 11a, and the hollow portion 1622 of the annular connecting part 1621 are aligned with one another along the optical axis d. Light is able to enter optical component in or below the hollow portion 1622 along the optical axis d. Based on a compact and efficient configuration, the camera device 1a has a lesser thickness along the optical axis d.

Figure 10:
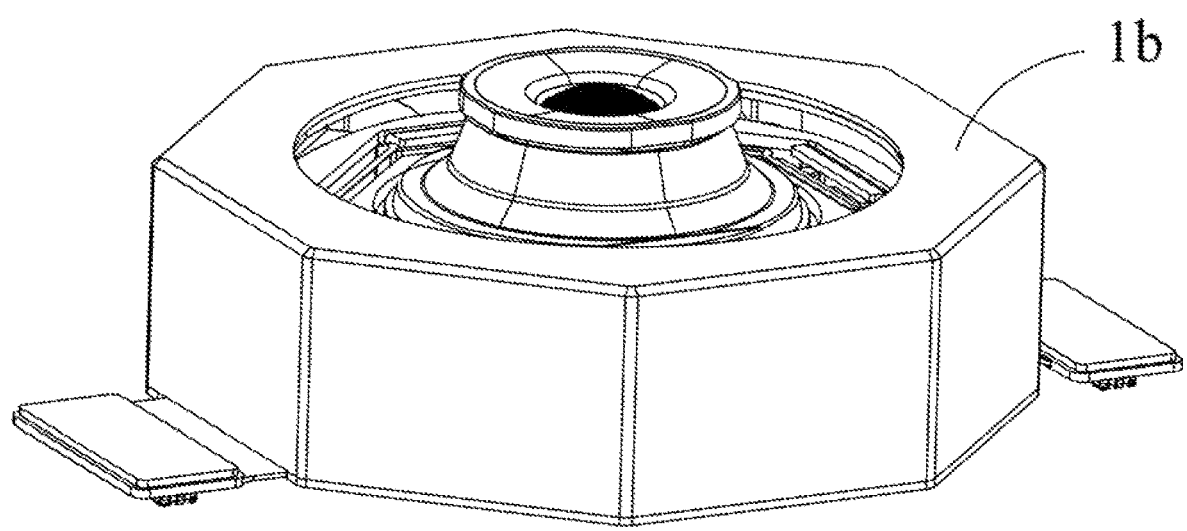
FIG. 10 is a schematic diagram of the camera device according to the second embodiment of the present disclosure.
Figure 11:
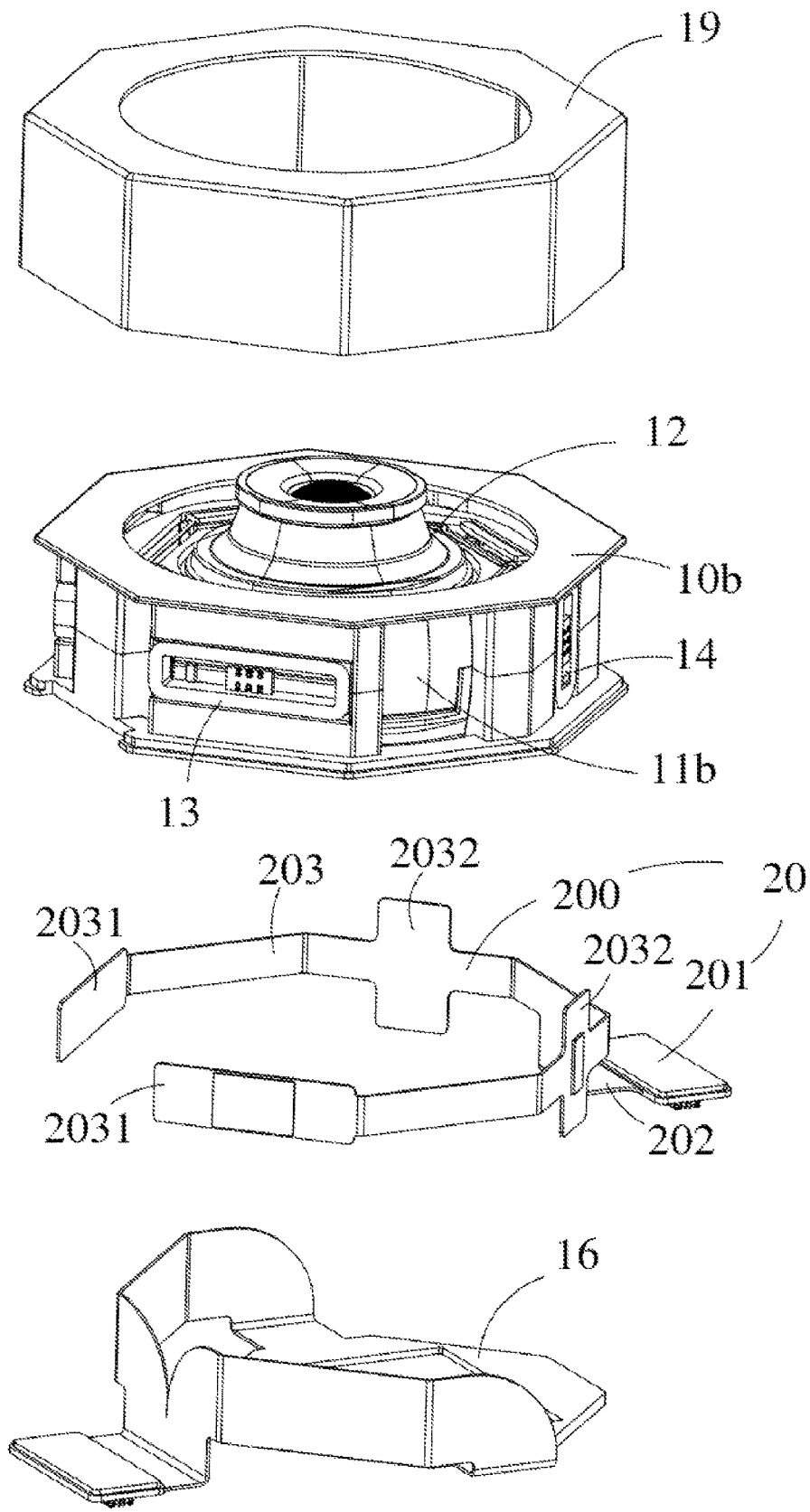
FIG. 11 is an exploded view of the camera device according to the second embodiment of the present disclosure.
Figure 12:
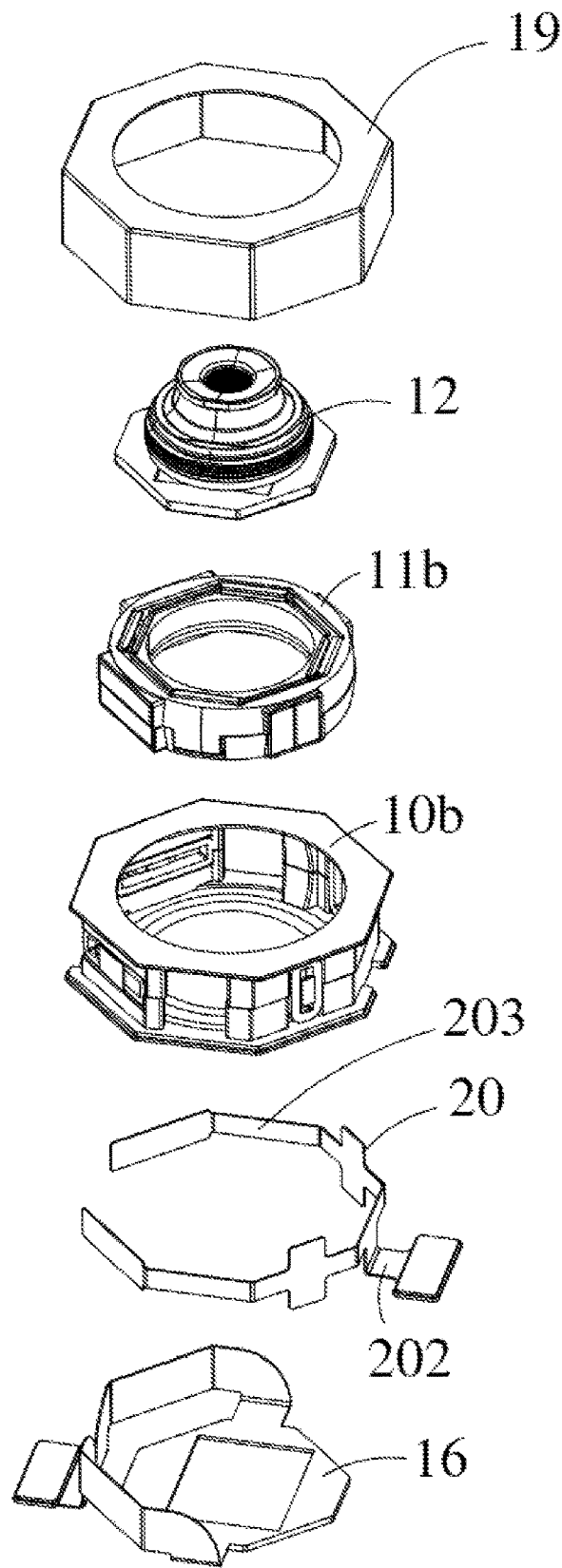
FIG. 12 is another exploded view of the camera device according to the second embodiment of the present disclosure.
Figure 13:
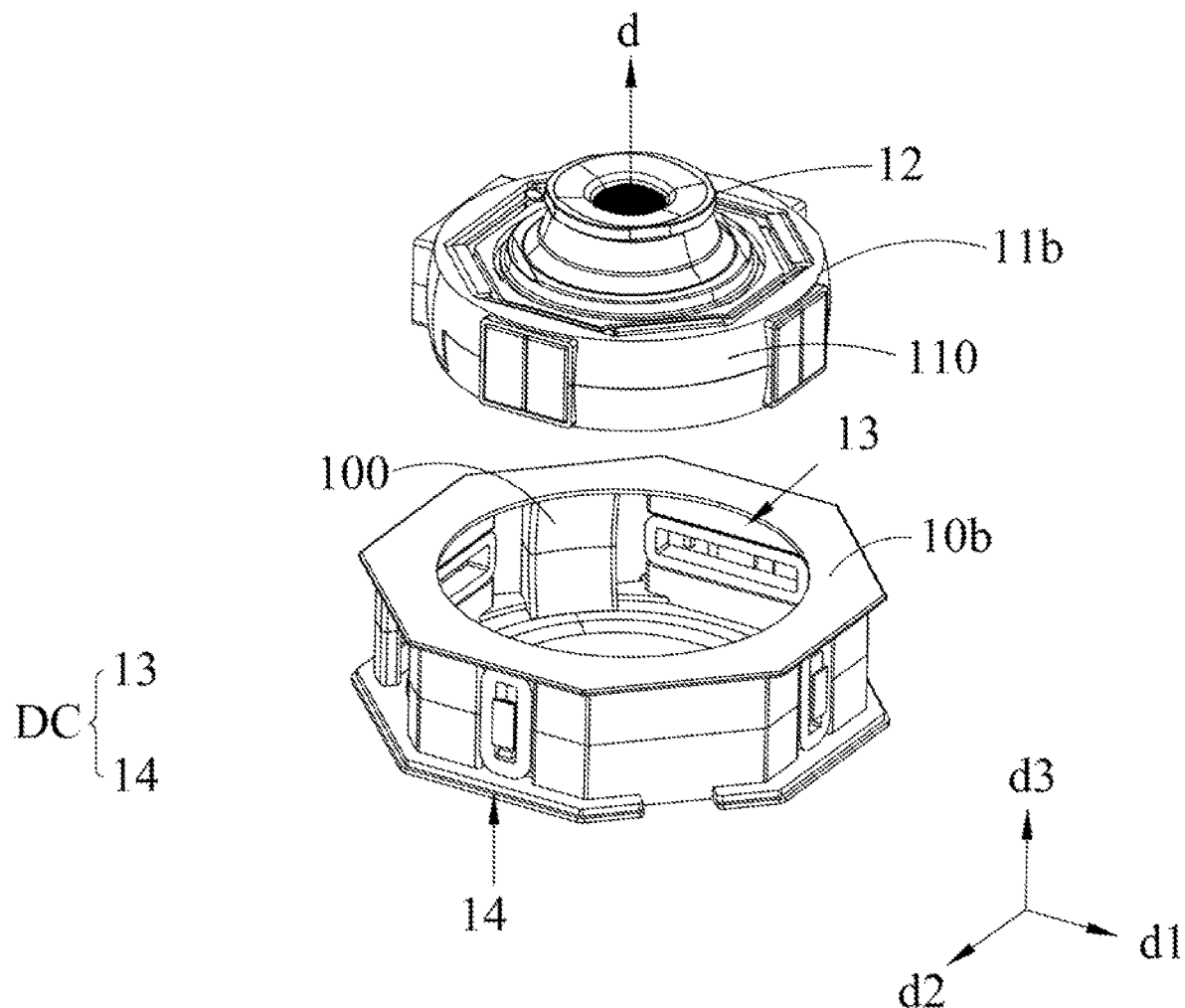
FIG. 13 is a schematic diagram of the first frame, the second frame, and the camera component according to the second embodiment of the present disclosure.

FIG. 10 to FIG. 12 respectively are a schematic diagram, an exploded view, another exploded view of the camera device according to the second embodiment of the present application, and FIG. 13 is a schematic diagram of the first frame body, the second frame body, and the camera component according to the second embodiment of the present application. More specifically, the camera device 1b includes a first frame 10b, a second frame 11b, a camera component 12, and a driving component DC (eg, a first driving component 13 and a second driving component 14). The first frame 10b includes a first arc surface 100, and the first arc surface 100 is at the inner surface of the first frame 10b and recesses inward to form a circular arc shape. The second frame 11b is movably disposed in the first frame 10b and includes a second arc surface 110. The second arc surface 110 is on the outer surface of the second frame 11b and protrudes outward to form a circular arc shape. The second arc surface 110 of the second frame 11b and the first arc surface 100 of the first frame 10b cooperate with each other. The driving component DC is configured to drive the second frame 11b to rotate with the first direction d1, the second direction d2, and the third direction d3 as axes. The first direction d1, the second direction d2, and the third direction d3 are orthogonal to each other, and the third direction d3 is parallel to an optical axis d of the camera component 12. Wherein, when the second frame 11b rotates with the first direction d1, the second direction d2, and/or the third direction d3 as the axis, the first arc surface 100 and the second arc surface 110 are configured to move relative to each other. Based on the features mentioned above, the operation principle of the present embodiment is the same as that of the first embodiment. Therefore, the elements with similar or identical functions and their descriptions may be referred to hereinbefore, and the detailed descriptions thereof are omitted.

Figure 14:
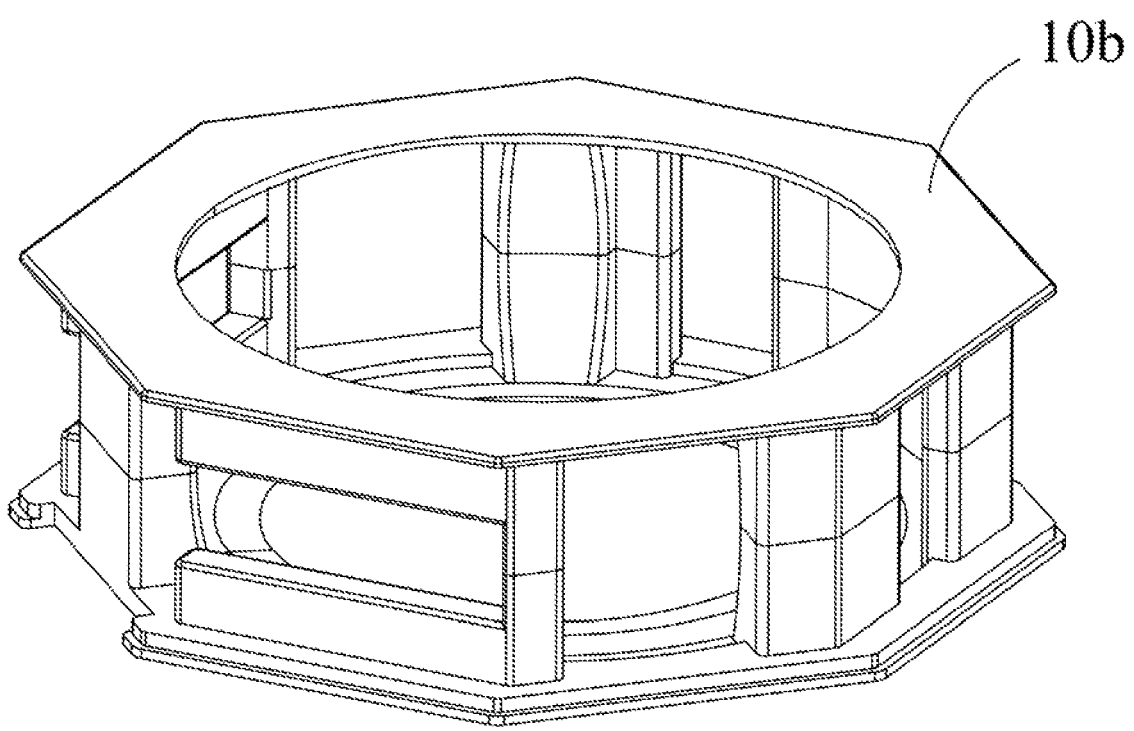
FIG. 14 is a schematic diagram of the first frame according to the second embodiment of the present disclosure.

FIG. 14 is a schematic diagram of the first frame according to the second embodiment of the present disclosure. As shown in the figure, the first frame 10b of the present embodiment is different from the first frame 10a of the first embodiment. Furthermore, the first frame 10b of the present embodiment is redesigned based on the base 180, the cover 181, and the first frame 10a in the first embodiment. The interference between components may be more effectively reduced by combining the first frame 10a with the base 180 and the cover 181 (ie, the first frame 10b). More specifically, the camera device 1b of the present embodiment does not include the elastic connecting piece 17, but uses a second circuit component 20 to replace the function of the elastic connecting piece 17 (explained hereinafter). As a result, the second frame 11b and the camera component 12 therein may have full degrees of freedom without the elastic connecting piece 17. Therefore, the providing of the guiding grooves 101 on the first frame 10b to assist the second frame 11b to rotate with the third direction d3 as the axis is unnecessary.

As shown in FIG. 11 and FIG. 12, in the present embodiment, the camera device 1b further includes a second circuit component 20. The second circuit component 20 is fixedly disposed on the first frame 10b and includes a second flexible circuit board 200 surrounding the first frame 10b and a second connector 201 disposed at one end of the second flexible circuit board 200. The second circuit component 20 is electrically connected to the first driving component 13 and the second driving component 14 of the driving component DC. As shown in FIG. 4, FIG. 11 and FIG. 12, the second flexible circuit board 200 surrounds the first frame 10b on a reference plane parallel to the first direction d1 and the second direction d2, and the second flexible circuit board 200 surrounds the optical axis d of the camera component 12. In some embodiments, the second flexible circuit board 200 further comprises a horizontal section 202 parallel to the first direction d1 and the second direction d2 and a surrounding section 202 parallel to the third direction d3. The second connector 201 is on the horizontal section 202, and the surrounding section 203 extends from the horizontal section 202 and surrounds the first frame 10b. The surrounding section 203 comprises a first connecting part 2031 and a second connecting part 2032. The first connecting part 2031 and the second connecting part 2032 are spaced from each other. The first connecting part 2031 is connected to the first driving component 13 of the driving component DC, and the second connecting part 2032 is connected to the second driving component 14 of the driving component DC. The length of the second connecting part 2032 along the third direction d3 is greater than the length of the first connecting part 2031 along the third direction d3.

Figure 15:
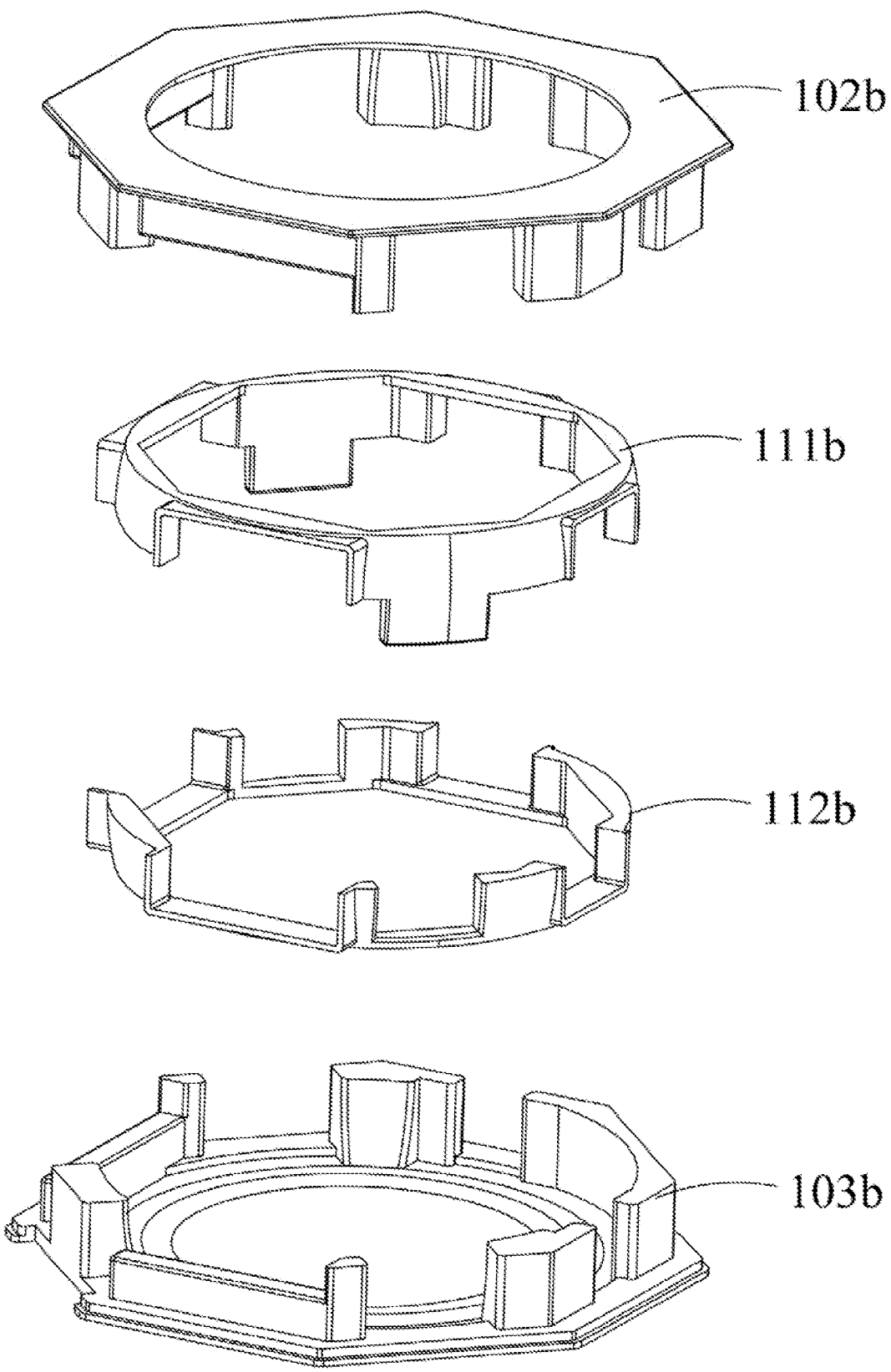
FIG. 15 is an exploded view of the first frame and the second frame according to the second embodiment of the present disclosure.

FIG. 15 is an exploded view of the first frame and the second frame according the second embodiment of the present disclosure. As shown in the figure, in some embodiments, the first frame 10b also includes a first upper frame 102b and a first lower frame 103b. The first upper frame 102b and first lower frame 103b are paired in third direction d3, and the first upper frame 102b and the first lower frame 103b together form the first arc surface 100. The second frame 11b further includes a second upper frame 111b and a second lower frame 112b. The second upper frame 111b and the second lower frame 112b are paired in the third direction d3, and the second upper frame 111b and the second lower frame 112b together form the second arc surface 110. It should be noted that the combination mentioned above is only an example, and the first frame 10b and the second frame 11b may also be integrally formed. Alternatively, the first frame 10b and the second frame 11b may also be assembled by more components, which may be adjusted according to the requirements of the manufacturing process.

In summary, the camera device of the present disclosure may be roughly divided into the first frame located on the outside, the second frame located in the inside, and the camera component located on the second frame. Furthermore, by disposing the contact surfaces between the first frame and the second frame as arc surfaces corresponding to each other, the second frame located inside the first frame and the camera component therein may rotate like a sphere. That is, when the second frame rotates with the first direction, the second direction, and/or the third direction as the axis, the first arc surface and the second arc surface are moving relative to each other. Therefore, the rotation of the second frame relative to the first frame may be guided to stabilize the rotation trajectory of the second frame. In this case, the interference between the various components may be reduced by the spherical structure, therefore the compensation angle may be greatly improved. In addition, the second frame and the camera component may also be driven by the driving component to roll with the direction parallel to the optical axis as the axis. That is, the present disclosure realizes a camera device with a large compensation angle and five-axis compensation. Furthermore, the first frame and the second frame may make the second frame relatively the first frame has the rotation degrees of freedom of the first direction, the second direction, and the third direction at the same time by the first arc surface and second arc surface. Wherein the first arc surface and second arc surface spherically match each other. Due to no need for disposing the rotation structure and rotation shaft corresponding to each axis, the overall complexity and cost are reduced.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A camera device, comprising:
   a first frame comprising a first arc surface, wherein the first arc surface is on an inner surface of the first frame and recesses inward to form a circular arc shape;
   a second frame movably disposed in the first frame and comprising a second arc surface, wherein the second arc surface is on an outer surface of the second frame and protrudes outward to form a circular arc shape, wherein the first arc surface and the second arc surface are matched with each other;
   a camera component disposed in the second frame;
   a driving component comprising a plurality of magnets and a plurality of coils, the magnets and the coils being disposed on the first frame and the second frame, wherein the coils are configured to be cooperated with the magnets to drive the second frame to rotate with a first direction, a second direction, and a third direction as axes, wherein the first direction, the second direction, and the third direction are perpendicular to one another, and the third direction is parallel to an optical axis of the camera component; when the second frame rotates with the first direction, the second direction, and/or the third direction as the axes, the first arc surface and the second arc surface move relative to each other;
   a first circuit component movably disposed on the first frame and electrically connected to the camera component, wherein the first circuit component comprises a first flexible circuit board surrounding the first frame and a first connector disposed at one end of the first flexible circuit board.

2. The camera device of claim 1, wherein the circular arc shape of the first arc surface and the circular arc shape of the second arc surface are concentric circles.

3. The camera device of claim 1, wherein a part of the magnets and the coils of the driving component forms a first driving component, and the first driving component comprises:
   a first magnet disposed on the second frame;
   a first coil disposed on the first frame and corresponding to the first magnet, wherein the first coil is configured to interact with the first magnet to drive the second frame to rotate with the first direction as an axis;
   a second magnet disposed on the second frame; and
   a second coil disposed on the first frame and corresponding to the second magnet, wherein the second coil is configured to interact with the second magnet to drive the second frame to rotate with the second direction as an axis.

4. The camera device of claim 1, wherein a part of the magnets and the coils of the driving component forms a second driving component, and the second driving component comprises:
   a third magnet disposed on the second frame;
   a third coil disposed on the first frame and corresponding to the third magnet, wherein the third coil is configured to interact with the third magnet to drive the second frame to positively rotate with the third direction as an axis;
   a fourth magnet disposed on the second frame; and
   a fourth coil disposed on the first frame and corresponding to the fourth magnet, wherein the fourth coil is configured to interact with the fourth magnet to drive the second frame to oppositely rotate with the third direction as an axis.

5. The camera device of claim 1, wherein the first flexible circuit board surrounds the first frame on a reference plane parallel to the first direction and the second direction, and the first flexible circuit board surrounds the optical axis of the camera component.

6. The camera device of claim 5, wherein the first flexible circuit board further comprises a horizontal section parallel to the first direction and the second direction and a surrounding section parallel to the third direction, the first connector is on the horizontal section, and the surrounding section extends from the horizontal section and surrounds the first frame.

7. The camera device of claim 6, wherein the horizontal section comprises an annular connecting part, and the annular connecting part has a hollow portion for receiving an optical component.

8. The camera device of claim 5, further comprising a second circuit component, wherein the second circuit component is disposed on the first frame and comprises a second flexible circuit board surrounding the first frame and a second connector disposed at one end of the second flexible circuit board, and the second circuit component is electrically connected to the driving component, the second flexible circuit board surrounds the first frame on the reference plane parallel to the first direction and the second direction, and the second flexible circuit board surrounds the optical axis of the camera component.

9. The camera device of claim 1, further comprising an elastic connecting piece disposed on the first frame and electrically connecting to the driving component.

10. The camera device of claim 1, further comprising a case disposed on the first frame, wherein the case has a camera opening, and a camera lens of the camera component is exposed by the camera opening.

11. The camera device of claim 1, wherein the first frame further comprises a first upper frame and a first lower frame, the first upper frame and the first lower frame are paired in the third direction, and the first upper frame and the first lower frame together form the first arc surface; the second frame further comprises a second upper frame and a second lower frame, the second upper frame and the second lower frame are paired in the third direction, and the second upper frame and the second lower frame together form the second arc surface.

12. The camera device of claim 1, wherein the first frame is an annular frame penetrated along the optical axis of the camera component.

13. The camera device of claim 12, wherein the second frame is an annular frame penetrated along the optical axis of the camera component.

14. A camera device, comprising:
   a first frame comprising a first arc surface, wherein the first arc surface is on an inner surface of the first frame and recesses inward to form a circular arc shape;
   a second frame movably disposed in the first frame and comprising a second arc surface, wherein the second arc surface is on an outer surface of the second frame and protrudes outward to form a circular arc shape, wherein the first arc surface and the second arc surface are matched with each other;
   a camera component disposed in the second frame;

a driving component comprising a plurality of magnets and a plurality of coils, the magnets and the coils being disposed on the first frame and the second frame, wherein the coils are configured to be cooperated with the magnets to drive the second frame to rotate with a first direction, a second direction, and a third direction as axes, wherein the first direction, the second direction, and the third direction are perpendicular to one another, and the third direction is parallel to an optical axis of the camera component; when the second frame rotates with the first direction, the second direction, and/or the third direction as the axes, the first arc surface and the second arc surface move relative to each other;

a base and a cover, wherein the base and the cover cover the first frame and the second frame, the base and the cover respectively have protrusions, the first frame has guiding grooves, and the protrusions of the base and the cover are correspondingly disposed in the guiding grooves.

15. The camera device of claim 14, wherein the base further has a guiding wall, and the guiding wall cooperates with the driving component to limit the first frame to move.

16. A camera device, comprising:
a first frame comprising a first arc surface, wherein the first arc surface is on an inner surface of the first frame and recesses inward to form a circular arc shape;
a second frame movably disposed in the first frame and comprising a second arc surface, wherein the second arc surface is on an outer surface of the second frame and protrudes outward to form a circular arc shape, wherein the first arc surface and the second arc surface are matched with each other;
a camera component disposed in the second frame;
a driving component comprising a plurality of magnets and a plurality of coils, the magnets and the coils being disposed on the first frame and the second frame, wherein the coils are configured to be cooperated with the magnets to drive the second frame to rotate with a first direction, a second direction, and a third direction as axes, wherein the first direction, the second direction, and the third direction are perpendicular to one another, and the third direction is parallel to an optical axis of the camera component; when the second frame rotates with the first direction, the second direction, and/or the third direction as the axes, the first arc surface and the second arc surface move relative to each other;
a second circuit component, wherein the second circuit component is fixedly disposed on the first frame and comprises a second flexible circuit board surrounding the first frame and a second connector disposed at one end of the second flexible circuit board, and the second circuit component is electrically connected to the driving component, the second flexible circuit board surrounds the first frame on a reference plane parallel to the first direction and the second direction, and the second flexible circuit board surrounds the optical axis of the camera component.

17. The camera device of claim 16, wherein the second flexible circuit board further comprises a horizontal section parallel to the first direction and the second direction and a surrounding section parallel to the third direction, the second connector is on the horizontal section, and the surrounding section extends from the horizontal section and surrounds the first frame.

18. The camera device of claim 17, wherein the surrounding section comprises a first connecting part and a second connecting part, the first connecting part and the second connecting part are spaced from each other, the first connecting part is connected to a first driving component of the driving component, and the second connecting part is connected to a second driving component of the driving component.

19. The camera device of claim 18, wherein a length of the second connecting part along the third direction is greater than a length of the first connecting part along the third direction.

* * * * *